(12) United States Patent
Sokolov et al.

(10) Patent No.: US 7,846,813 B2
(45) Date of Patent: Dec. 7, 2010

(54) METHOD AND APPARATUS FOR BONDED SUBSTRATES

(75) Inventors: Yuri V. Sokolov, Sandy, UT (US);
Donald Roy, West Jordan, UT (US);
Tyler Hook, Salt Lake City, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 492 days.

(21) Appl. No.: 12/025,514

(22) Filed: Feb. 4, 2008

(65) Prior Publication Data

US 2009/0197053 A1     Aug. 6, 2009

(51) Int. Cl.
*H01L 21/30* (2006.01)

(52) U.S. Cl. .................... 438/455; 438/457

(58) Field of Classification Search .......... 438/455–459
See application file for complete search history.

(56) References Cited

U.S. PATENT DOCUMENTS 6,583,029 B2  6/2003  Abe et al.
6,908,027 B2  6/2005  Tolchinsky et al.
7,161,224 B2  1/2007  Tolchinsky et al.

*Primary Examiner*—Matthew C Landau
*Assistant Examiner*—Candice Y Chan
(74) *Attorney, Agent, or Firm*—Townsend and Townsend and Crew LLP

(57) ABSTRACT

A method for forming bonded substrates includes providing a plurality of substrates, each of which having a top surface. A characteristic length for each of the plurality of substrates is determined by: determining a topographical profile of the top surface of the substrate from an interior portion to an edge portion along a radial direction, determining a highest point of the profile, and defining the characteristic length as a distance from the highest point to the edge portion. A first substrate and a second substrate are selected where at least one of the first or the second substrates has a characteristic length shorter than a predetermined length. The first substrate and the second substrate are brought into contact and form bonded substrates, with the top surface of the first substrate facing the top surface of the second substrate.

22 Claims, 10 Drawing Sheets

METHOD AND APPARATUS FOR BONDED SUBSTRATES

BACKGROUND OF THE INVENTION

The present invention is directed to method and apparatus for forming bonded substrates. More particularly, the invention provides a method and device for forming bonded substrates having small unbounded edge regions. Merely by way of example, techniques in accordance with the invention may be applied to forming bonded silicon wafers, e.g., for SOI (silicon on insulator) device applications. But it would be recognized that the invention has a much broader range of applicability. For example, the invention can be applied to forming bonded substrates for applications in power devices, thin film devices, as well as compound semiconductor devices.

Bonded substrates are widely used in microelectronics fabrication. FIG. 1A is a cross-sectional view diagram illustrating bonded wafers. As shown, wafers 101 and 102 are bonded together by physical or chemical bonding forces. For example, an SOI wafer can be produced by bonding two silicon wafers together. Silicon oxide films are formed on both wafers. The wafers are brought in close contact and bonded together. A heat treatment can be used to increase the bonding strength. One of the wafers can be made thinner by polishing and etching or, alternatively, by cleaving techniques. In some applications, two wafers can be bonded together having a variety of films including nitride, oxide, or even without any film between the silicon wafers.

Bonded substrates can offer certain advantages in device applications. For example, a thin SOI layer can be used as a substrate for fabricating devices requiring low parasitic capacitance/resistance. In other applications, substrate bonding techniques are used to transfer a device layer to a suitable substrate.

Even though bonded substrates find wide applications, conventional substrate bonding techniques often suffer from many limitations. For example, bonded substrates formed using conventional bonding techniques often have relatively large non-bonded regions near the edges of the substrates. FIG. 1B is a magnified cross-sectional view diagram illustrating a periphery portion of bonded wafers 101 and 102 in FIG. 1A. As shown, the edges of wafers 101 and 102 both include polished periphery regions provided by substrate vendors. For example, silicon wafer vendors provide a wafer specification including bevel roll off, which is an indication of the extent of the edge region. An example of the bevel roll-off is shown in FIG. 1B as $D_1$. A typical bevel roll-off region can be about 200 um in length. When two substrates are bonded together, a portion near the periphery remains non-bonded. Conventional methods for substrate bonding suffer from relatively large non-bonded areas at the periphery. As shown as in FIG. 1B, the length of the non-bonded region $D_2$ is substantially greater than the bevel roll-off $D_1$.

This non-bonded area, also known as edge exclusion region, is undesirable for many reasons. For example, the non-bonded edge exclusion region reduces usable area in the bonded substrate. The non-bonded region also tends to weaken the bonded substrate structure. Therefore, damages can occur during subsequent processing. Additionally, particles or contaminants can accumulate near the edge regions.

Various techniques have been proposed for reducing the edge exclusion region of bonded substrates. For example, heat treatment and/or external constrained pressure have been introduced to reduce edge exclusion. These conventional techniques may be effective for some applications, but they tend to involve complicated processes and expensive equipment.

Thus, there is a need for a technique whereby the quality of bonded substrates can be improved while maintaining a simple and cost-effective manufacturing process.

BRIEF SUMMARY OF THE INVENTION

In accordance with an embodiment of the invention, a method for forming bonded substrates includes determining a characteristic length for each of a plurality of substrates. A topographical profile of the top (polished) surface of the substrate is determined from an interior portion to an edge portion of the substrate along a radial direction. The highest point of the profile is noted. The characteristic length is then defined as a distance from the highest point to the edge portion. A first substrate and a second substrate are selected for bonding. At least one of the two substrates has a characteristic length shorter than a predetermined length. The first substrate and the second substrate are brought into contact and form bonded substrates, with the top surface of the first substrate facing the top surface of the second substrate.

In one embodiment, the profile of the top surface for each of the plurality of substrates is determined using a surface profiling apparatus. For example, the profile of the top surface for each substrate can be determined using an atomic force microscope.

In another embodiment, each of the plurality of substrates is a silicon wafer. Depending on the application, the method can also be used with other substrates, for example, glass substrate, ceramic substrates, or other semiconductor substrates such as germanium, silicon germanium, or compound semiconductors, etc.

In one embodiment, the interior portion is near a center point of the substrate. In an embodiment, the edge portion can be a point at the edge of the substrate. Alternatively, the edge portion can be determined by the bevel roll-off specified by the substrate vendor.

In a specific embodiment, the predetermined length is related to a length of non-bonded edge region. The predetermined length can be chosen such that at least one of the bonded substrates has a short non-bonded edge region. For example, in a specific embodiment, the predetermined length can be chosen to be about 1 mm for a desired edge exclusion length of about 1 mm.

The topography of the substrates can have various features. In one example, the highest point of the profile is about from 200 nm to about 800 nm above the interior portion. In another example, the characteristic length can vary in a range of about 1.5 mm to about 10 mm.

According to another embodiment of the invention, a method is provided for forming bonded substrates having an non-bonded edge region that is equal to or shorter than a predetermined edge exclusion length. In an embodiment of the invention, a relationship is established between an edge topographical characteristic length of the substrates and the edge exclusion regions in the resultant bonded substrates. In the method, a target characteristic length is first determined based on the predetermined desired edge exclusion length. The method then includes determining a characteristic length for each of a plurality of substrates. First, a topographical profile of the top surface of the substrate is determined from an interior portion to an edge portion of the substrate along a radial direction. Then the highest point of the profile is noted. The characteristic length is then defined as a distance from the highest point to the edge. The method also includes selecting a first substrate and a second substrate from the plurality of substrates, at least one of two substrates having a characteristic length shorter than the target characteristic length. The first and the second substrates are then brought into contact to form the bonded substrates.

In accordance with an alternative embodiment, the invention provides an apparatus for bonding substrates. The apparatus includes a base member having a top surface and a recessed region. The recess region is configured for receiving a first substrate or both the first and the second substrates. In an embodiment, the recessed region has a depth that is approximately equal to a thickness of the first substrate. In another embodiment, the recessed depth is approximately equal to the combined thicknesses of both substrates. The apparatus also includes a plurality of support members (spacers) disposed over the top surface for supporting a second substrate peripherally over the first substrate. Each support member is configured to vary a separation between the first substrate and the second substrate. In a specific embodiment, each of the support members includes a beveled surface for supporting the second substrate and varying its elevation. The bonding apparatus further includes a pressure bar configured to cause a center portion of the second substrate to contact the first substrate while the support members maintain peripheral separation between the first substrate and the second substrate. A bonded region between the first and the second substrates is expanded radially from the center portion when the support members are moved to reduce the separation between the first and the second substrates.

In a specific embodiment, the pressure bar is coupled to a cantilever configured for positioning the pressure bar member over the second substrate. In another embodiment, the apparatus also includes a block configured for pressing the second substrate against the first substrate during bonding. In an embodiment, the apparatus includes an opening in the block for allowing the pressure bar to contact the center portion of the second substrate. In an alternative embodiment, the block includes protruding edge portions for applying pressure to peripheral regions of the second substrate.

In another embodiment, the apparatus further includes a plurality of pins disposed on the base top surface along a periphery of the recessed region for positioning the second substrate. In yet another embodiment, the apparatus includes a separate heating element placed in the recessed pressure block allowing substrate bonding at an elevated temperature.

The apparatus can be constructed using various suitable materials. In a specific example, the support members are made of a metal, Teflon, or Teflon-coated metal or other rigid material. Similarly, the base member can be made of a metal, Teflon, or Teflon-coated metal or other rigid material.

According to yet another embodiment of the invention, a method for forming bonded substrates is provided. The method includes providing a first substrate and providing a second substrate over the first substrate. The second substrate is supported peripherally to maintain a predetermined distance between the first substrate and the second substrate. The method includes causing a center portion of the second substrate to form a contact with the first substrate. Then the contact region between the first and the second substrates is expanded radially outward, until a contact is formed between edge regions of the first and the second substrates.

In an embodiment, the method includes applying a force to the center portion of the second substrate to cause the center portion to contact the first substrate. In another embodiment, the separation between peripheral regions of the first and second substrates is reduced to cause the contact region between the first and the second substrates to expand radially outward. The method also includes continuing to reduce separation between peripheral regions of the first and the second substrates to allow contact between edge regions of the first and the second substrates.

According to another embodiment, the invention provides a bonded substrate. The bonded substrate includes a first substrate and a second substrate bonded to the first substrate. The second substrate bonds entirely to the first substrate except 1 mm of the peripheral edge of the first substrate. In other words, a bonded substrate having an edge exclusion region as small as about 1 millimeter can be formed according to an embodiment of the present invention. In a specific example, the bonded substrate is a silicon wafer. In another example, the bonded substrate includes a silicon-on-insulator wafer. Of course, depending on the application, the bonded substrate can also include other semiconductor wafers such as silicon germanium, germanium, or compound semiconductors such as GaAs, etc.

Many benefits are achieved by way of the present invention over conventional techniques. For example, in some embodiments, the invention provides methods for forming bonded substrates having reduced non-bonded edge regions. Additionally, the invention provides a process that is compatible with conventional process technology and surface characterization technology. In another embodiment, the invention also provides a simple and cost-effective apparatus for forming bonded substrates that can improve the quality of the bonded substrates. Depending upon the embodiment, one or more of these benefits may be achieved. These and other benefits will be described in more detail throughout the present specification.

Various additional objects, features, and advantages of the present invention can be more fully appreciated with reference to the detailed description and accompanying drawings that follow.

DETAILED DESCRIPTION OF THE INVENTION

In accordance with embodiments of the present invention, a method for forming bonded substrates is provided. In one embodiment, the method includes determining a surface topographical characteristic that is related to the length of the non-bonded edge region, also known as the edge exclusion region, of bonded substrates. The method includes selecting suitable substrates according to the surface topographical characteristic. In another embodiment, the invention provides a method for forming bonded substrates by first forming a central contact between the substrates and then allowing the contact region to expand outward radially to the edge regions. Depending on the embodiments, edge exclusion regions in bonded substrates can be reduced using the methods provided in the present invention. In a specific embodiment, edge exclusion region as small as 1 mm in width has been obtained. Additionally, the invention also provides a simple and cost-effective apparatus for forming bonded substrates that can improve the quality of the bonded substrates.

Depending upon the embodiment, the present invention includes various features, which may be used. These features include the following:

1. A method for determining a surface topographical profile characteristic of a substrate which can be used in selecting substrates for forming bonded substrates;
2. A method for selecting substrates for forming bonded substrates having reduced edge exclusion.
3. An apparatus for substrate bonding, which is simple, flexible, vacuum-less, portable and cost-effective.
4. A method for bonding two substrates where the bonding propagates from the substrate center to the edge region while providing a constrained bond strengthening.

As shown, the above features may be in one or more of the embodiments to follow. These features are merely examples, which should not unduly limit the scope of the claims herein. One of ordinary skill in the art would recognize many variations, modifications, and alternatives.

Figure 1A:
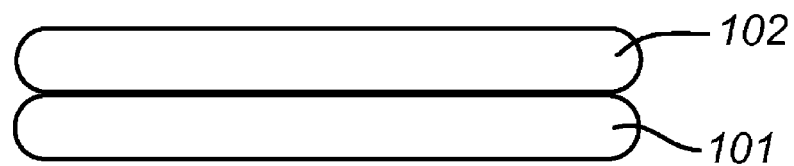
FIG. 1A is a cross-sectional view diagram illustrating bonded wafers.
Figure 1B:
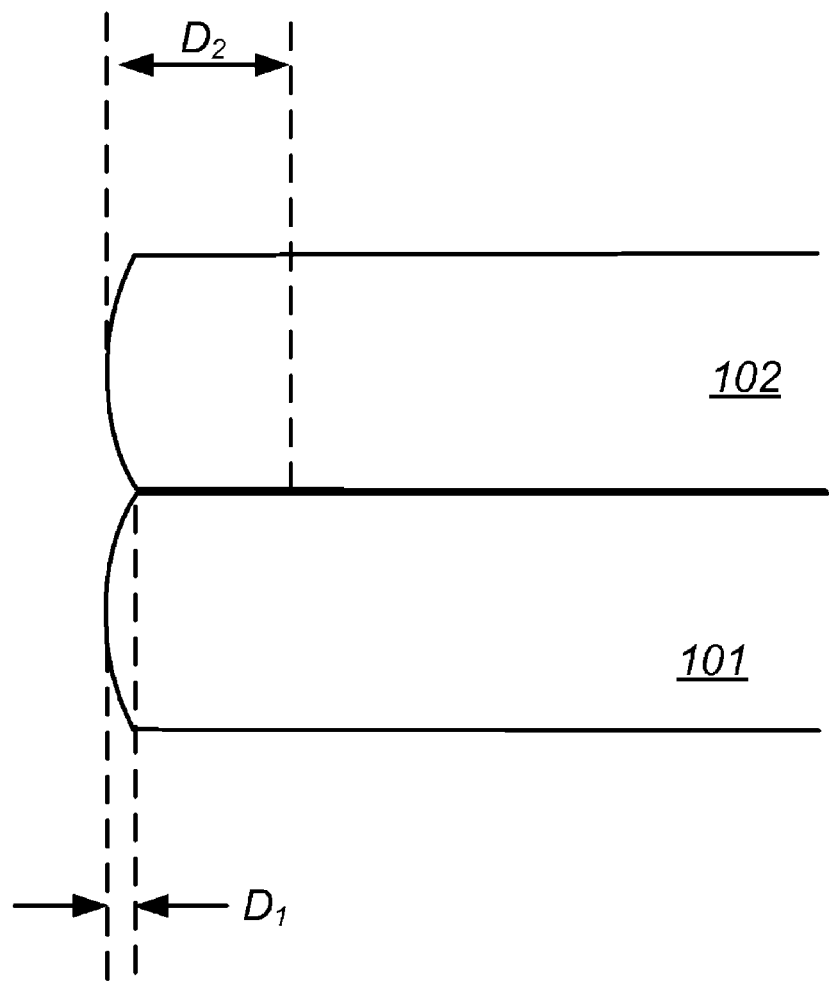
FIG. 1B is a magnified cross-sectional view diagram illustrating a periphery portion of the bonded wafers of FIG. 1A.
Figure 2:
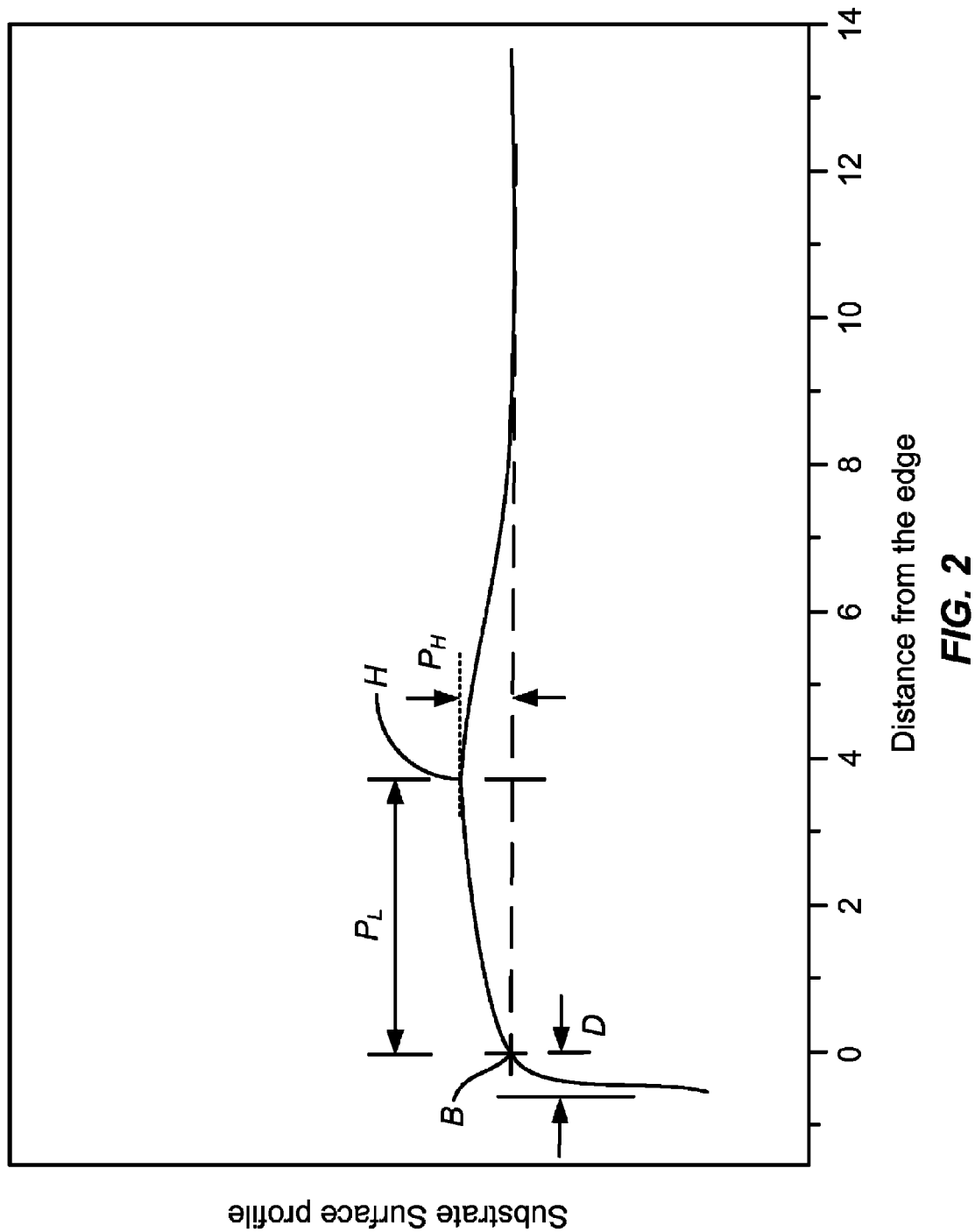
FIG. 2 is a simplified view diagram illustrating a method for selecting a substrate for bonding according to an embodiment of the present invention.

FIG. 2 is a simplified view diagram illustrating a method for selecting a substrate for bonding according to an embodiment of the present invention. This diagram is merely an example, which should not unduly limit the scope of the claims herein. One of ordinary skill in the art would recognize other variations, modifications, and alternatives. FIG. 2 shows an example of substrate surface topographical profile near an edge region of a substrate. The substrate can be, for example, a silicon wafer. The substrate can also be other substrates used in forming bonded substrates or substrate transfer, for example, other semiconductor substrates such as silicon germanium or compound semiconductors, glass substrates or ceramic substrates. The substrate surface topographical profile can be determined using any one of various surface profiling instruments, such as an atomic force microscope (AFM).

In FIG. 2, the surface profile of a silicon wafer extends from an interior portion of the wafer to an edge portion. The interior portion can be a point on the surface sufficiently far away from the edge such that the surface profile includes a substantially flat region that is representative of the surface of the wafer. In a specific example, the surface profile can be measured from a center point of the wafer to an edge. Depending upon the embodiment, the interior portion can also be relatively close to the edge, for example, 10-20 mm from the edge. As shown, the surface profile includes a point B that marks a point in the edge portion of the wafer. In FIG. 2, a bevel roll-off distance D is often specified by silicon wafer vendors as a measure of the edge region. A typical bevel roll-off D can be, for example, 200 um in length. The surface profile in FIG. 2 also includes a peak, or highest point, H, that rises above the surface of the bulk region to the right. In a specific embodiment, the height at point H is defined as projection height $P_H$. Similarly, a characteristic length, from the highest point H to the edge of the wafer, is defined as projection length, $P_L$. In this definition, the edge of the wafer can be a point in the edge region of the wafer. In a specific example, the edge of the wafer can be the roll-off point. The projection length and project height can vary from substrate to substrate. In some silicon wafers, for example, the projection height $P_H$ can vary from 200 to 800 nm, whereas the projection length, $P_L$ can vary from 1.5 to 10 mm, or longer.

According to embodiments of the invention, the projection length $P_L$ and projection height $P_H$ of the substrates can affect the shape and quality of bonded substrates. More particularly, the projection length $P_L$ plays an important role in determining the length of the edge exclusion region in bonded substrates. On the other hand, the projection height $P_H$ can cause air pockets to build up in bonded wafers. Some examples are discussed below.

Figure 3:
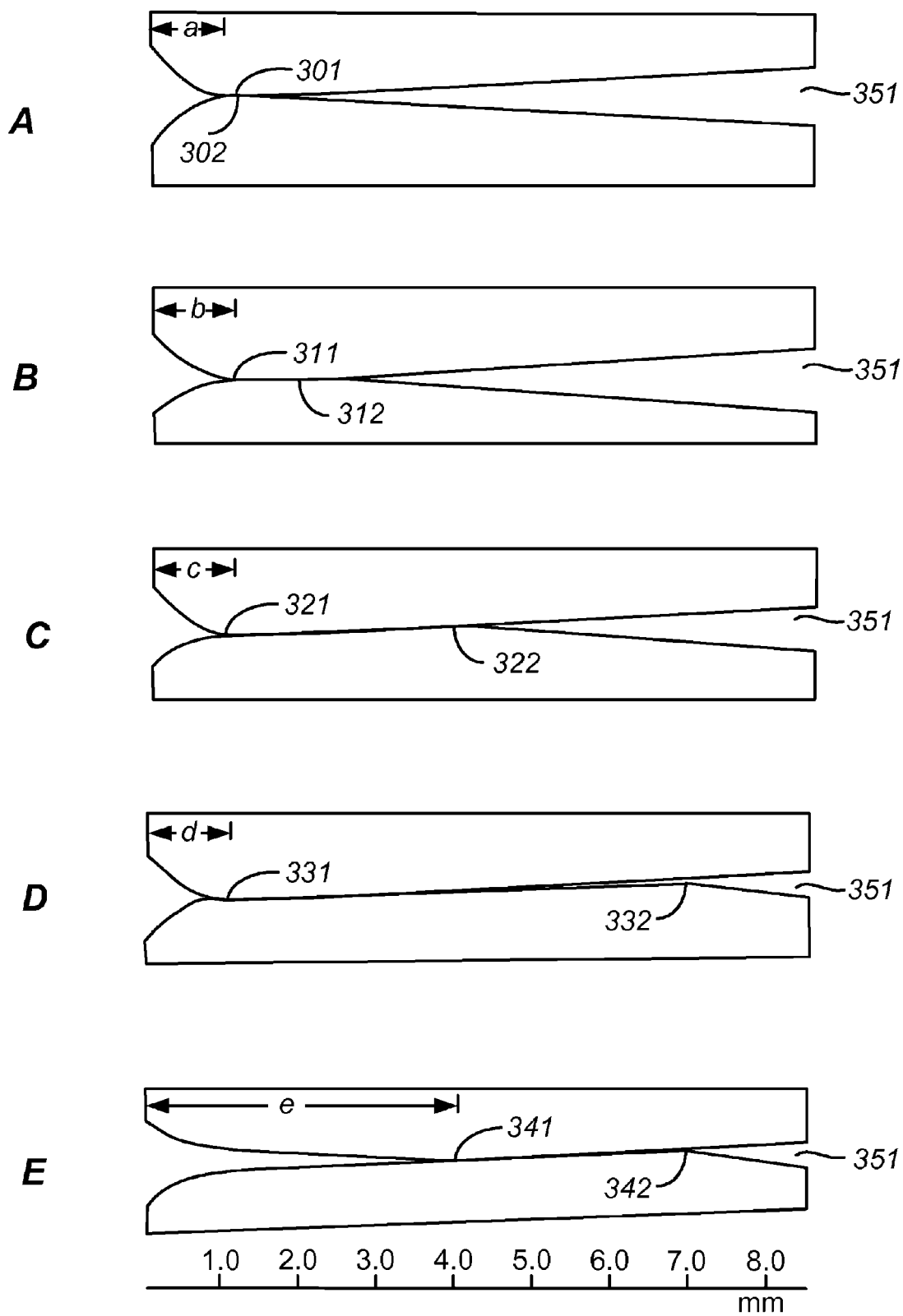
FIGS. 3A-3E are simplified view diagrams illustrating effects of substrate surface topographical characteristics on substrate bonding according to an embodiment of the present invention.

FIGS. 3A-3E are simplified view diagrams illustrating effects of substrate surface topographical characteristics on wafer bonding according to an embodiment of the present invention. As shown, each of FIGS. 3A-3E illustrates surface profiles of edge regions of two wafers in bonding alignment. In FIG. 3A, the point of the projection height $P_H$ in the surface profile is marked as 301 for the top wafer and 302 for the bottom wafer. The corresponding projection length $P_L$ can be determined as the distance between 301 to the edge of the wafer for the top wafer and between 302 and the edge of the wafer for the bottom wafer. The length of the edge exclusion region in FIG. 3A is marked as "a." Similarly, in FIG. 3B, the points for the projection height $P_H$ are marked as 311 and 312, respectively, and the length of the edge exclusion region in FIG. 3B is marked as "b." In FIG. 3C, the points for the projection height $P_H$ are 321 and 322, respectively, and the length of the edge exclusion region is marked as "c." In FIG. 3D, the points for the projection height $P_H$ are 331 and 332, respectively, and the length of the edge exclusion region is marked as "d." Additionally, in FIG. 3E, the points for the projection height $P_H$ are 341 and 342, respectively, and the length of the edge exclusion region is marked as "e."

In FIGS. 3A-3E, air pockets 351 can be seen in the gap between the top wafer and the bottom wafer. Air pockets are undesirable in bonded wafers because they can weaken the bonding and trap particles and contaminants. A method for reducing air pockets is discussed below in connection with FIG. 10.

It can be seen from FIGS. 3A-3E that when one of the two wafers being bonded has a short projection length $P_L$, the edge exclusion region appears to be relatively short. For example, in FIGS. 3C and 3D, the projection lengths $P_L$ for the bottom wafers are relatively long, as indicated by points 322 and 332, respectively. On the other hand, the length edge exclusion region, "c" and "d", respectively, are substantially the same as "a" and "b". Therefore, the length of the exclusion region appears to be associated with the projection lengths $P_L$ for the top wafers, as indicated by points 321 and 331, respectively. This observation can be summarized in FIG. 4 below.

Figure 4:
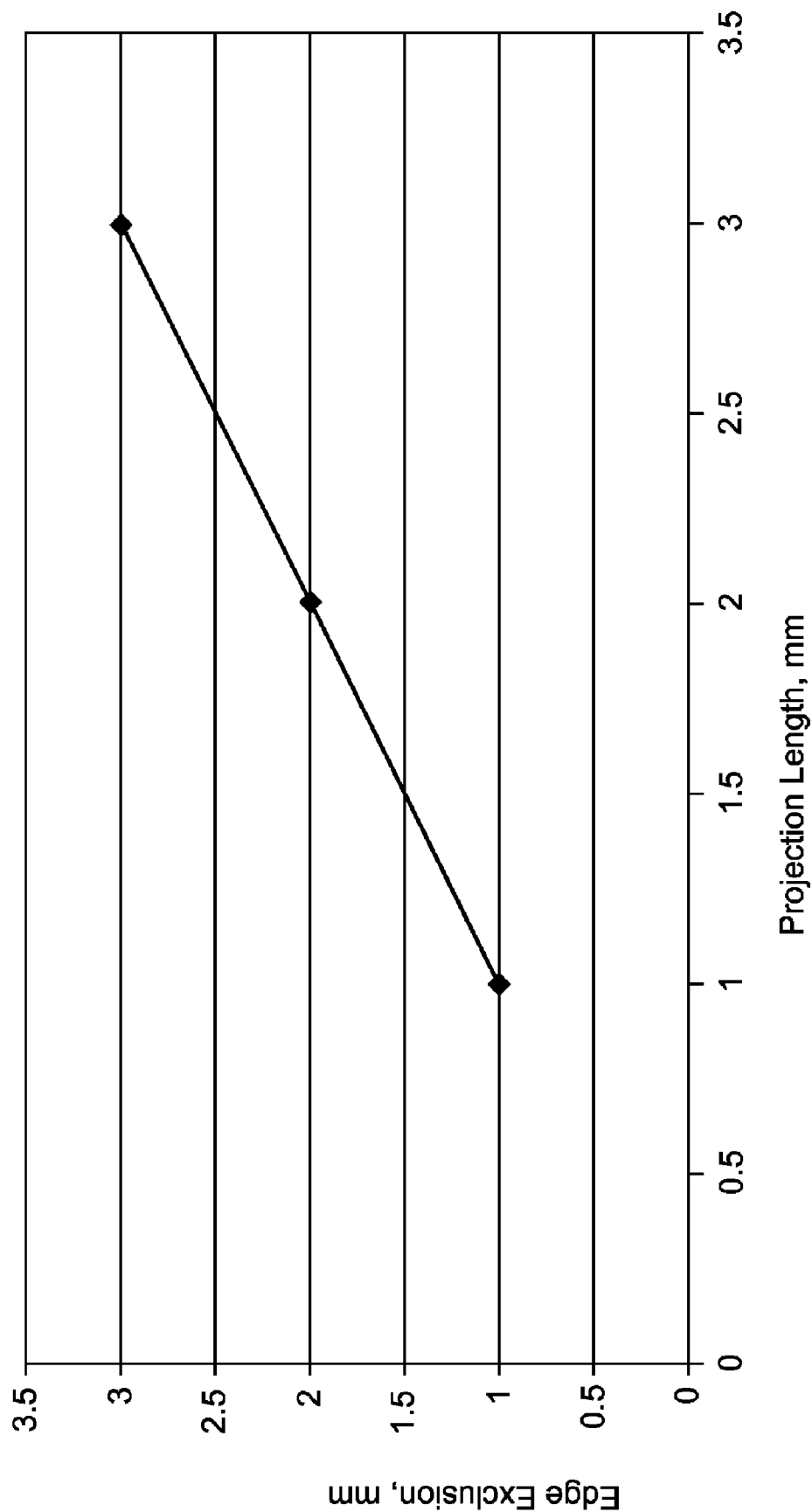
FIG. 4 is a plot illustrating a relationship between the length of edge exclusion in bonded wafers and a surface topographical characteristic (the projection length) of the wafers according to an embodiment of the present invention.

FIG. 4 is a plot illustrating a relationship between the length of edge exclusion in bonded wafers and the shortest projection length of one of the wafers according to an embodiment of the present invention. This diagram is merely an example, which should not unduly limit the scope of the claims herein. In FIG. 4, the vertical axis shows the length of edge exclusion of a pair of bonded wafers, and the horizontal axis shows the shorter of the projection lengths $P_L$ for any of the two wafers. It can bee seen that the edge exclusion length of the bonded pair of wafers seems to have a strong dependence on the shorter projection length $P_L$. For example, if the shorter projection length $P_L$ of the two wafers is about 3 mm, then the edge exclusion length is about 3 mm. Similarly, if the shorter projection length $P_L$ of the two wafers is about 1 mm, then the edge exclusion length is about 1 mm. In our experiments, the relationship between edge exclusion and projection length appears to hold under various conditions, including the bevel roll-off shape, wafer bow, warp, or TTV (total thickness variation), etc. Additionally, the relationship appears to be relatively independent of the existence or thickness of a low-temperature oxide (LTO) layer and/or polysilicon layer on the back side of the wafer.

Even though FIG. 4 is based on data obtained from silicon wafers, the technique and result can be applied to other substrates according to embodiments of the present invention. For a given group of substrates, a projection length $P_L$ can be determined for each substrate, and a graph depicting the relationship between projection length $P_L$ and edge exclusion length can be made, similar to that in FIG. 4. The result can be used in selecting substrates for forming bonded substrates having reduced edge exclusions. For example, to achieve a desired edge exclusion, a maximum characteristic length (as defined by the application), i.e., projection length $P_{LMAX}$, can be determined from a graph like FIG. 4. Substrates that have projection length $P_L$ below the maximum projection length $P_{LMAX}$ are selected for forming bonded substrates. In a specific embodiment, one of the two substrates used in forming the bonded pair of substrates should have projection length $P_L$ below the maximum projection length $P_{LMAX}$.

Figure 5A:
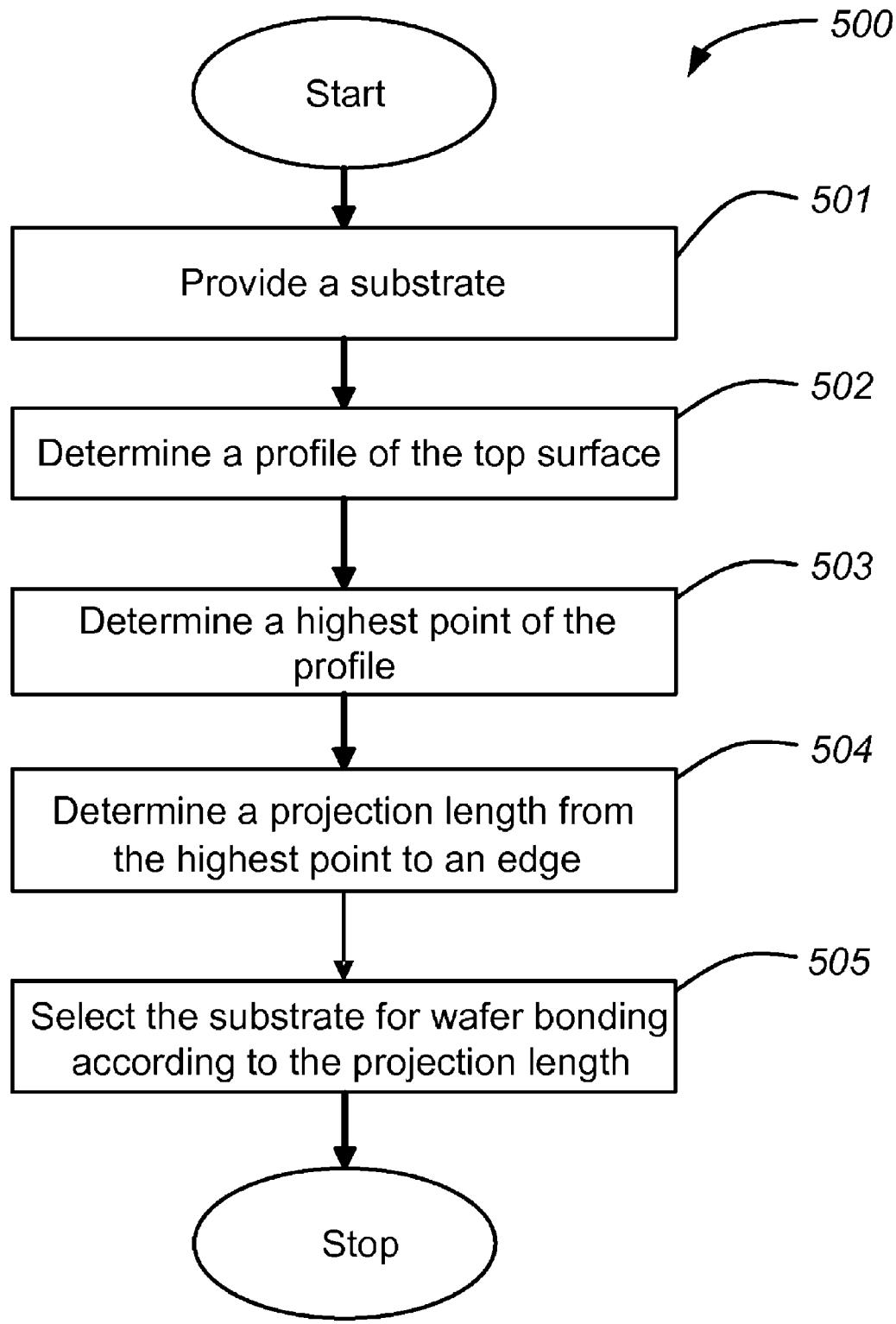
FIG. 5A is a simplified flow chart illustrating a method for selecting a substrate for forming bonded substrates having reduced edge exclusion according to an embodiment of the invention.

FIG. 5A is a simplified flow chart illustrating a method for selecting a substrate for forming bonded substrates having reduced edge exclusion according to a specific embodiment of the invention. The method includes selecting substrate that has a desired surface topographical profile characteristic and can be briefly outlined below.

1. (Process 501) Provide a substrate—The substrate has a top surface which includes an interior portion and an edge portion.
2. (Process 502) Determine a profile of the top surface—The topographical profile of the top surface is measured from the interior portion to the edge portion along a radial direction.
3. (Process 503) Determine a highest point of the profile—As discussed above, the height of this highest point relative to the bulk substrate surface is named projection height in a specific embodiment of the invention.
4. (Process 504) Determine a length from the highest point to the edge portion—As discussed above, this length can also be called the projection length and is a characteristic length of the substrate which is closely related to the "extended edge exclusion region" according to an embodiment of the invention.
5. (Process 505) Select the substrate for wafer bonding if the distance is below a predetermined characteristic length. The predetermined length can be determined using the method discussed above in connection with FIGS. 2-4.

Figure 5B:
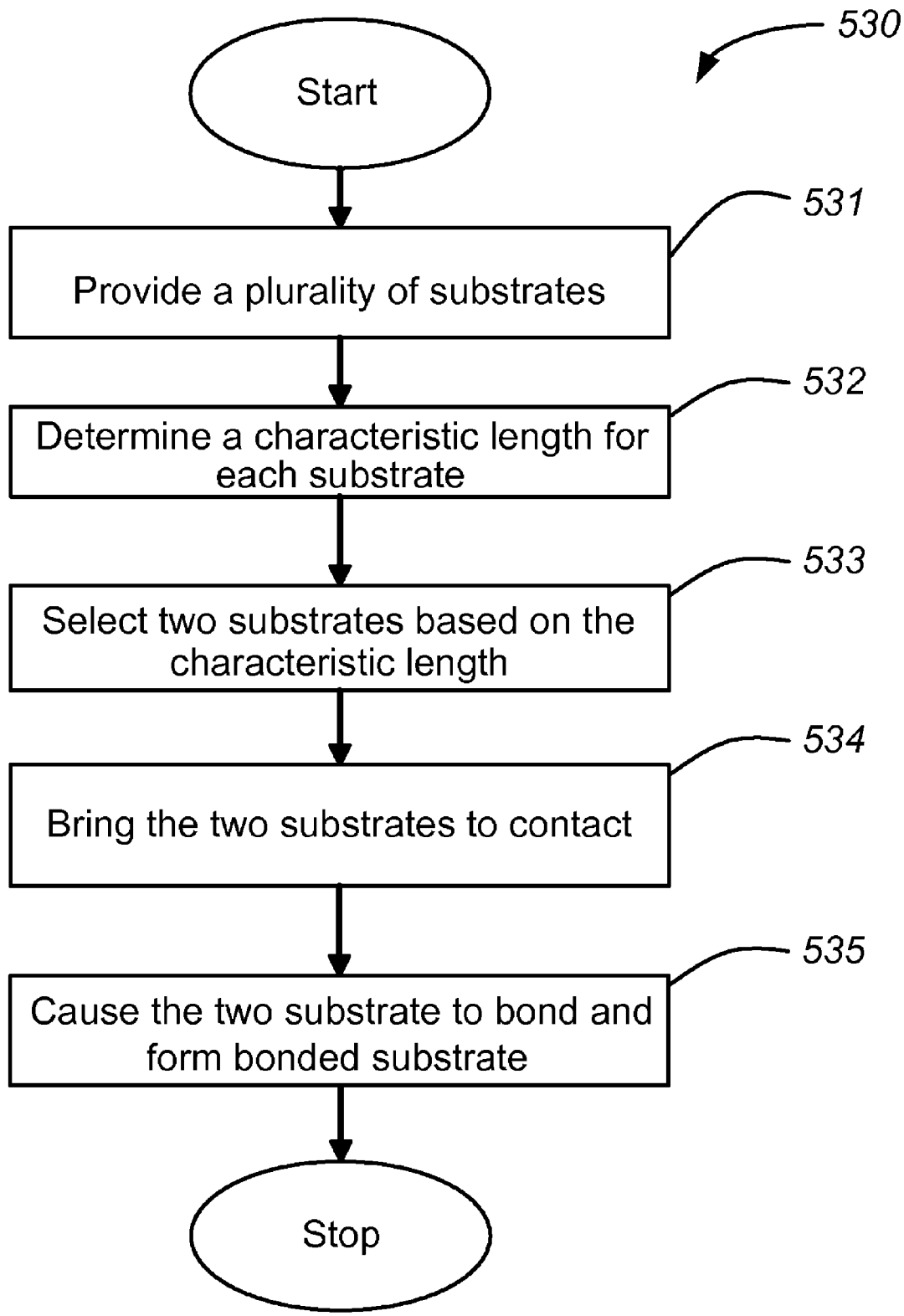
FIG. 5B is a simplified flow chart illustrating a method of substrate bonding according to another embodiment of the present invention.

FIG. 5B is a simplified flow chart illustrating a method of substrate bonding according to another embodiment of the present invention. The method can be briefly outlined below with reference to the process flow in FIG. 5B.

1. (Process 531) Provide a plurality of substrates, each of the plurality of substrates having a top surface;
2. (Process 532) Determine a characteristic length for each of the plurality of substrates, the characteristic length being determined by the process described above in connection with FIG. 5A for the projection length;
3. (Process 533) Select a first substrate and a second substrate, at least one of them must have a characteristic length shorter than a predetermined length;
4. (Process 534) Bring the first substrate and the second substrate into contact, the top surface of the first substrate facing the top surface of the second substrate; and
5. (Process 535) Cause the first and the second substrate to form the bonded substrate.

The above sequences of processes provides methods for forming bonded substrates according to embodiments of the present invention. As shown, the methods use a combination of processes including a way of selecting substrates according to a specific surface topographical property to form bonded substrates. Other alternatives can also be provided where steps are added, one or more steps are removed, or one or more steps are provided in a different sequence without departing from the scope of the claims herein. Further details of the present method can be found throughout the present specification.

Figure 6A:
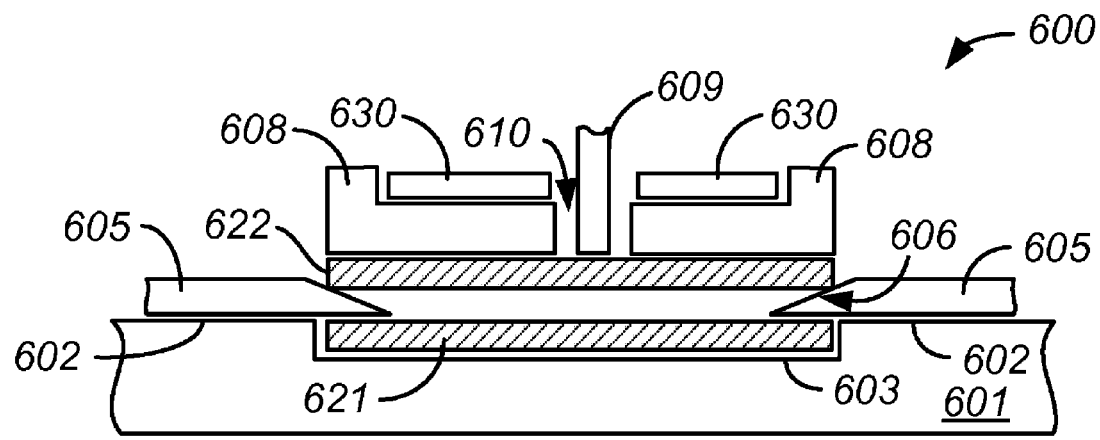
FIG. 6A is a simplified cross-sectional view diagram illustrating an apparatus for substrate bonding according to an embodiment of the present invention.

FIG. 6A is a simplified cross-sectional view diagram illustrating an apparatus 600 for wafer bonding according to an embodiment of the present invention. This diagram is merely an example, which should not unduly limit the scope of the claims herein. One of ordinary skill in the art would recognize other variations, modifications, and alternatives. As shown, bonding apparatus 600 includes a base member 601, e.g., a chuck, having a top surface 602 and a recessed region 603 which recessed from the top surface 602. The recessed region is configured for receiving one (621) or both (621 and 622) substrates. The bonding apparatus 600 also includes a plurality of support members 605 disposed over the top surface 602 and capable to move along the surface 602. Each support member has a beveled surface 606. The plurality of support members 605 is configured to support a second substrate 622 along with a heavy block 608. In a specific embodiment, the support members 605 can also be designated as spacers.

In FIG. 6A, the second wafer 622 is positioned on the beveled surface 606 of each of the support members 605. The second substrate is supported above the first wafer by the beveled surfaces. As the support members 605 are moved outward from the recessed region, the second substrate is lowered, and the spacing between the second substrate and the first substrate is reduced. When the support members are completely moved out of the recessed region, the second substrate is lowered to the top of the first substrate, and a contact is formed between the two substrates to form a bonded pair of substrates.

In an embodiment, bonding apparatus 600 also includes a plurality of pins or posts (shown as 831 in FIG. 8, not shown in FIG. 6) that are disposed on the top surface along a periphery of the recessed region for aligning the second substrate over the first substrate in the recessed region. In a specific embodiment, block 608 is disposed over the second wafer for providing a downward pressure during bonding. A pressure bar 609 can be lowered through an opening in block 608 to apply pressure to a center portion of the second wafer.

Although the above has been shown using a selected group of components for the substrate bonding apparatus 600, there can be many alternatives, modifications, and variations. For example, some of the components may be expanded and/or combined. Other components may be inserted to those noted above. Depending upon the embodiment, the arrangement of components may be interchanged with others replaced. For example, in bonding apparatus 600 of FIG. 6A, the pressure bar 609 is depicted as having an elongated shape. In other embodiments, pressure bar 609 can have different sizes and shapes. For example, pressure bar can be relatively thin and provides a point contact to the second substrate. In another example, the pressure bar can be relative thick and contact a substantial fraction of the center portion of the second wafer. It is also noted that in FIG. 6A the components are drawn for illustrative purposes only and are not necessarily drawn to scale. Further details of these components are found throughout the present specification and more particularly below.

In an embodiment, the base member, or chuck, 601 can be made of a rigid material. For example, base member 601 can be made of Teflon or a metal such as stainless steel. In another example, the chuck 601 can include a Teflon-coated metal. In the example of FIG. 6A, the recessed region is formed in the chuck and is as close to the same size as the substrates used in forming bonded substrates. The depth of the recessed region is selected to facilitate substrate bonding. In a specific embodiment, the depth of the recessed region can be between one or two substrate thicknesses. Of course, depending on the embodiment, other thicknesses can also be used.

In a specific embodiment, the support members (spacers) 605 can be made of Teflon. Depending on the embodiment, other materials, such as metal or Teflon-coated metal, can also be used. In the example of FIG. 6A, the thickness of the spacers 605 is about 1 cm, and the angle of the beveled surface at one end of the spacer is approximately 45°. The spacers are used to support the second substrate 622 at the start of the bonding process. In a particular example, the spacers maintain a spacing of about 5 mm between the second substrate and the first substrate, while the second substrate overlaps the beveled ends of the spacers by about 4 mm. Of course, these dimensions can be adjusted depending on the application. During the bonding process, the spacers 605 can be moved outward to allow the second substrate to contact the first substrate starting from the center point.

In an embodiment, the bonding apparatus also includes a block or plate 608 for applying pressure to the substrates during bonding. Plate 608 can be made of a material having appropriate weight to provide a downward pressure during substrate bonding. In a specific embodiment, the block 608 is made of stainless steel and weighs about 20 to 25 N that provides pressure of about 100 to 140 N/m². As shown in Fig. 6A, a block can be placed on the second wafer by its plane surface providing an additional pressure to the entire substrate area. Depending on the embodiments, block 608 can have different shapes. For example, as shown in FIG. 6A, block 608 has an asymmetric cross section, with protruding portions around the edges. A plate-like heater element 630 may be placed onto the recess of the block which allows substrate bonding to take place at an elevated temperature.

In a specific embodiment, the block 608 has an opening 610 in its center portion. An elongated pressure bar 609 is disposed through the opening 610 for applying a separate pressure to a center region of the second substrate 622. The localized pressure causes the center portion of the second substrate to deform/bend. This enables bonding to start at the center regions of the substrates. In a specific embodiment, the bar 609 is made of stainless steel and has a termination diameter of about 2 mm and a weight of about 10N. Of course, in other embodiments and applications, there can be other variations and modifications to the various components of the bonding apparatus 600.

Figure 6B:
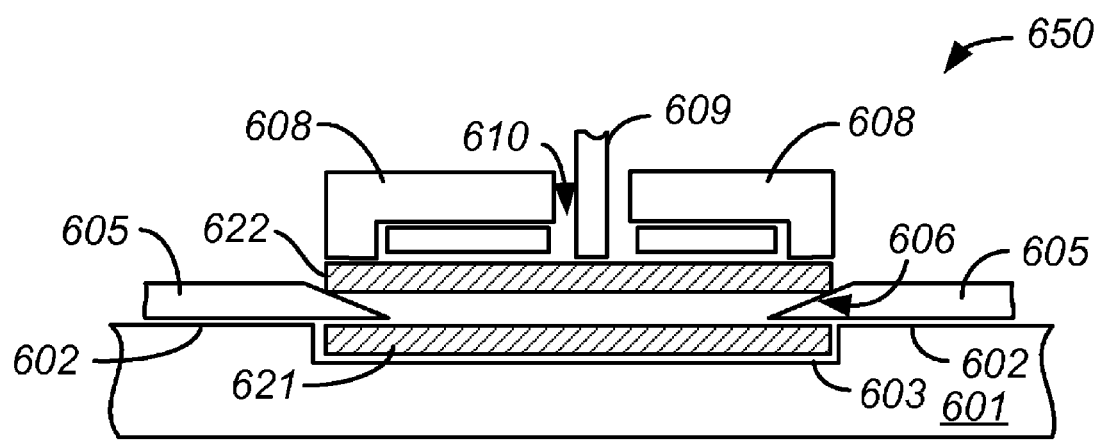
FIG. 6B is a simplified side-view diagram of an apparatus for wafer bonding according to an alternative embodiment of the present invention.

FIG. 6B is a simplified cross-sectional view diagram of an apparatus 650 for substrate bonding according to an alternative embodiment of the present invention. As shown, apparatus 650 is similar to apparatus 600 discussed above. It is noted, however, that block 608 is now placed upside down with the protruding edges facing substrate 622. In this configuration, block 608 can be used for applying a pressure at the edges of the substrates.

Figure 7:
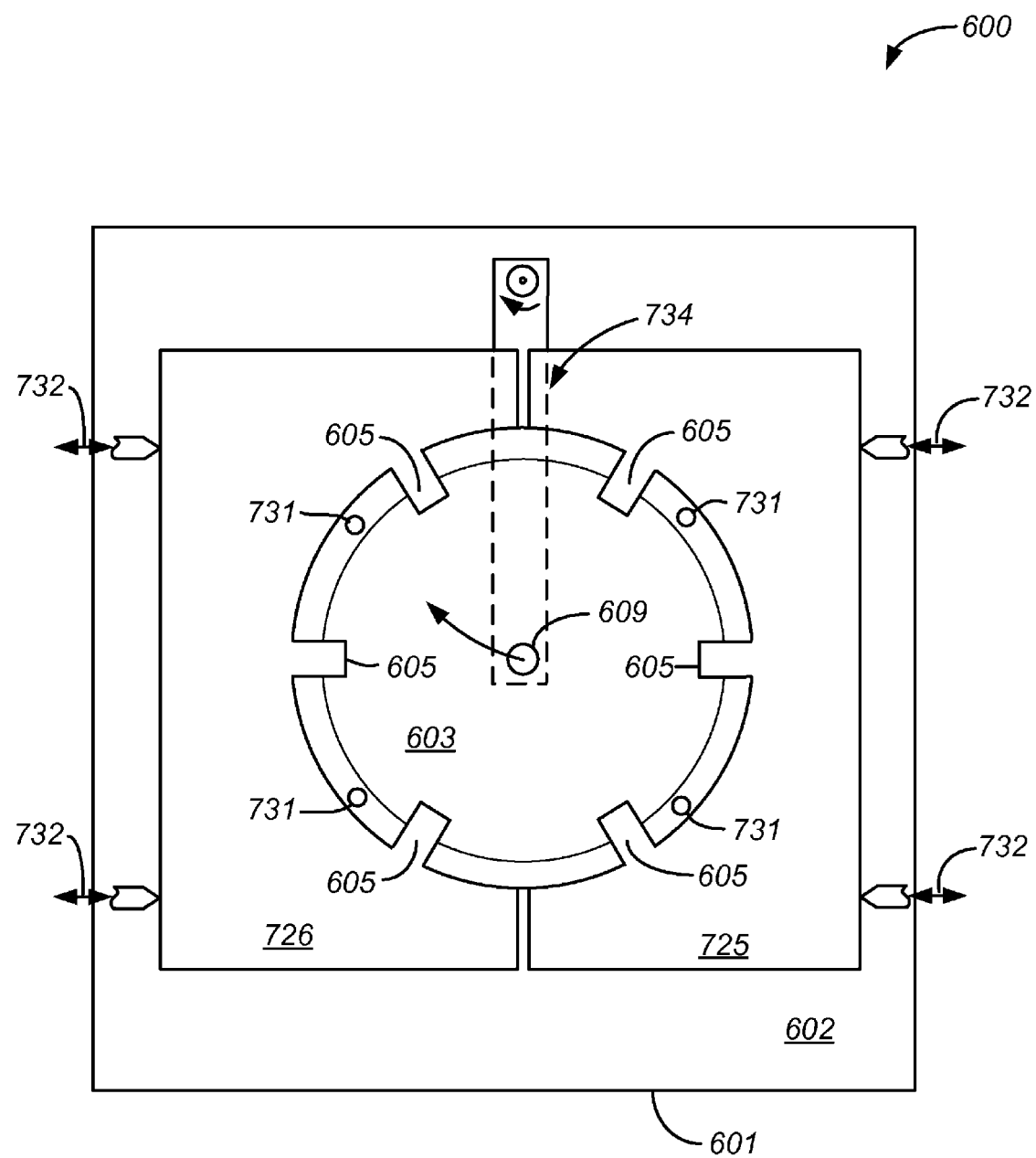
FIG. 7 is a simplified top-view diagram of an apparatus for wafer bonding according to another embodiment of the present invention.

FIG. 7 is a simplified top-view diagram of an apparatus for substrate bonding 600 that illustrates details of certain components in a specific implementation. This diagram is merely an example, which should not unduly limit the scope of the claims herein. As shown, bonding apparatus 600 includes a base member 601, e.g., a chuck, with a top surface 602 and a recessed region 603 recessed from the top surface. The recessed region is configured for receiving a first substrate (not shown). The bonding apparatus 700 also includes a plurality of support members 605, each of which having a beveled end (not shown). In FIG. 7, the support members 605 are shown to be integral parts of support blocks 725 and 726, respectively. The plurality of support members 605 are configured to support a second substrate (not shown). As support blocks 725 and 726 are moved to the right and to the left, respectively, the support members 605 are moved away from recessed region to allow a substrate to be lowered into the recessed region for bonding. The movement of support blocks 725 and 726 are indicated by arrow 732 in FIG. 7. In an embodiment, a plurality of pins, or posts, 731 are disposed on the top surface along a periphery of the recessed region for aligning the second substrate over the recessed region. In FIG. 7, four pins 731 are provided. In another specific embodiment, another number of pins can be included in the apparatus. In FIG. 7, the pressure bar 609 is shown to be connected to a cantilever 734, which can rotate the pressure bar 609 within the recessed region redirecting the bar from the wafer center to the wafer periphery. The cantilever 734 also aligns the pressure bar 609 to apply pressure either to a center portion or to the periphery of the substrates. The movement of the support elements can be monitored and controlled using manual or conventional electronic and mechanical techniques.

Although the above has been shown using a selected group of components for the substrate bonding apparatus 600, there can be many alternatives, modifications, and variations. For example, some of the components may be expanded and/or combined. Other components may be inserted to those noted above. Depending upon the embodiment, the arrangement of components may be interchanged with others replaced. For example, in FIG. 7, the support members 605 are built into two support blocks 725 and 726. In an alternative embodiment, the support members 605 can be individual pieces which can be moved radially outward away from the recessed region. Further details of these components are found throughout the present specification and more particularly below.

Figure 8A:
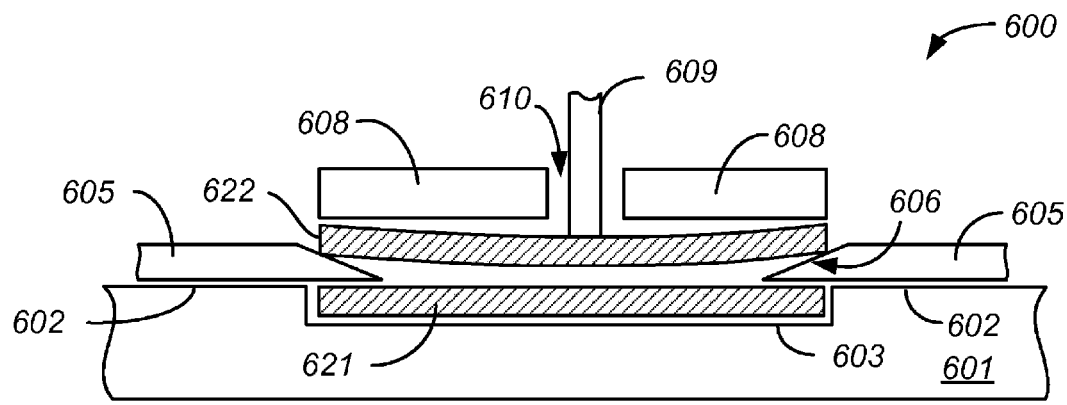
FIGS. 8A-8C is are simplified view diagrams illustrating a method for wafer bonding according to an embodiment of the present invention.
Figure 8B:
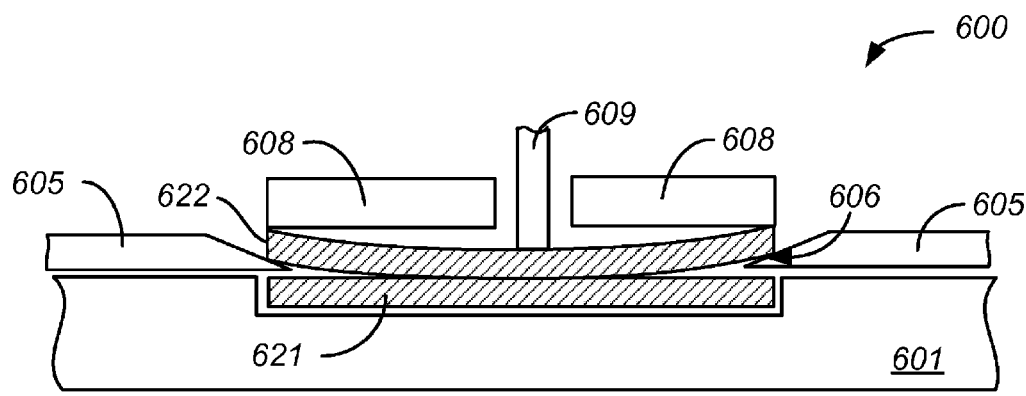
Figure 8C:
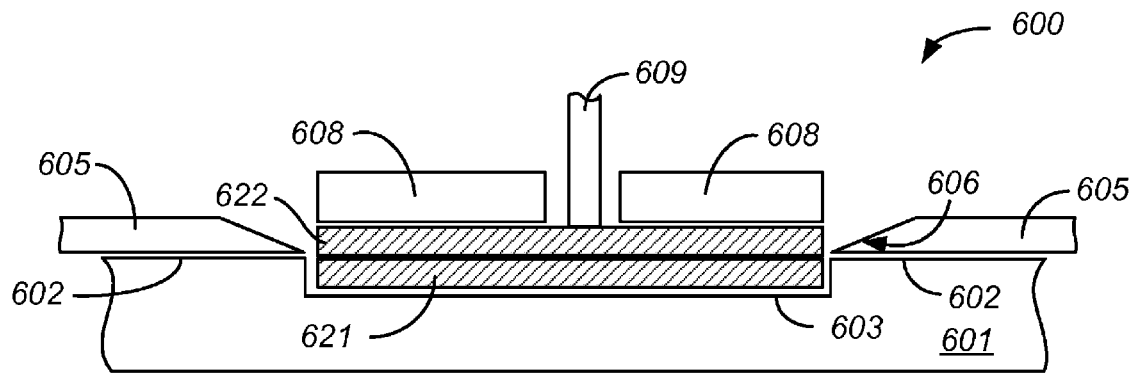

FIGS. 8A-8C are simplified view diagrams illustrating a method for substrate bonding according to an embodiment of the present invention. FIG. 8A illustrates the bonding apparatus 600 in FIG. 6 including the first substrate 621 positioned in the recessed region 603 of the chuck 601. The second substrate 622 is supported by the beveled surfaces 606 of support members 605 over the first substrate. Weight block 608 is disposed over the second substrate 622. Here, weight block 608 is shown to have a rectangular cross-section. However, it is understood that it can have different shapes including, e.g., those shown in FIG. 6A and FIG. 6B. The center pressure bar 609 is lowered, causing the second substrate 622 to concave downward.

In FIG. 8B, the support members 605 are gradually moved outward from the recessed region of the chuck. As a result the separation between peripheral regions of the first and second substrates is reduced to allow contact between the first and second substrates in a center region which then expands radially outward. As the support members 605 continue to be moved out of the recessed region, contacts are formed between entire areas of the first and the second substrates. Eventually, in FIG. 8C, substantially full contact is formed between the first and the second substrates, and bonded substrates are formed. At that time, weight block 608 presses the substrates together providing constrained bond strengthening.

Figure 9:
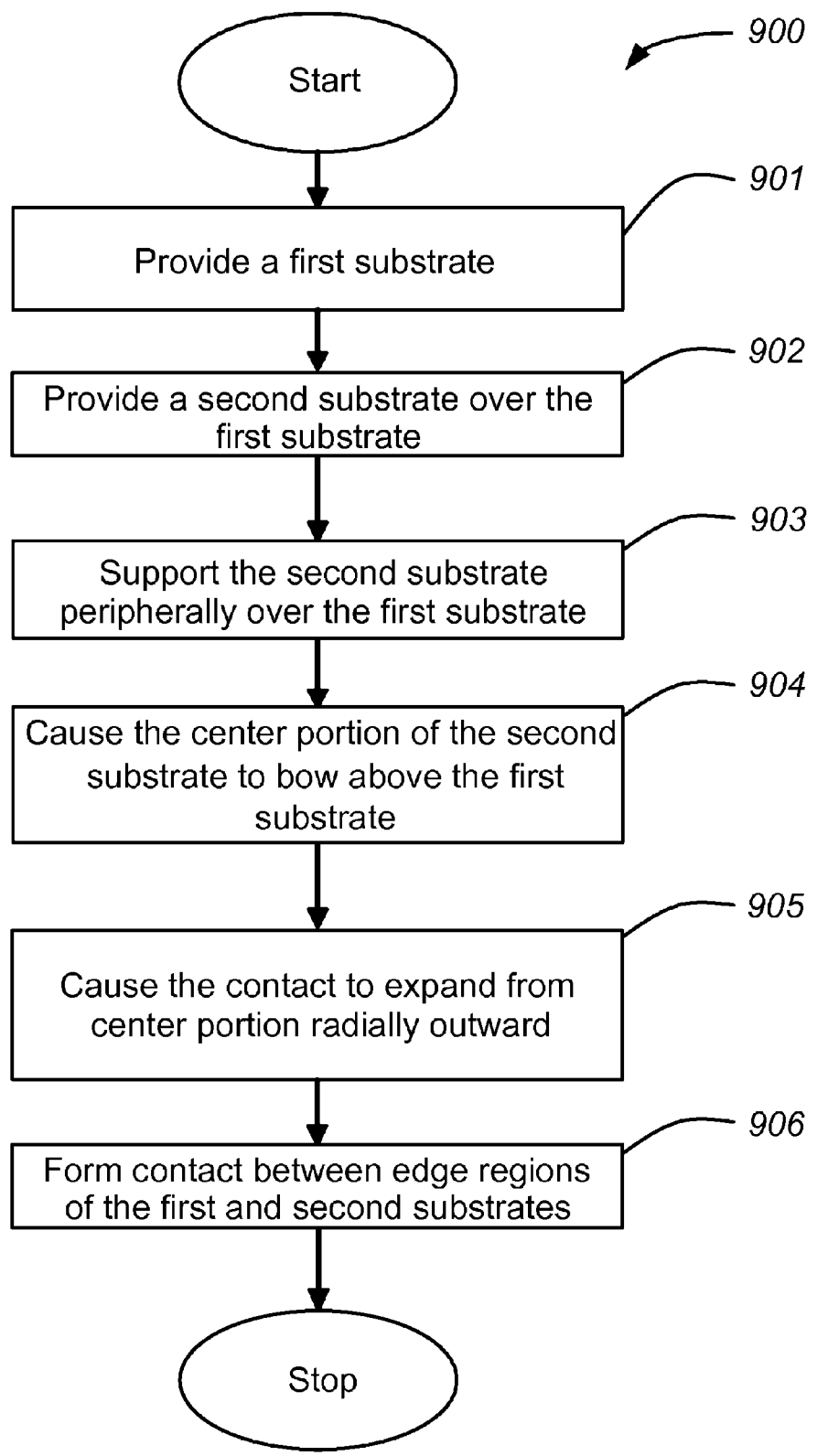
FIG. 9 is a simplified flow chart illustrating a method of wafer bonding according to an embodiment of the present invention.

FIG. 9 is a simplified flow chart illustrating a method for forming bonded substrates having reduced edge exclusion according to an embodiment of the present invention. The method can be briefly outlined below with reference to the processes in FIG. 9.

1. (Process 901) Provide a first substrate;
2. (Process 902) Provide a second substrate over the first substrate;
3. (Process 903) Support the second substrate peripherally to maintain a predetermined distance between the first substrate and the second substrate;
4. (Process 904) Cause the center portion of the second substrate to contact the first substrate;
5. (Process 905) Cause contact between the first and the second substrates to expand radially outward; and
6. (Process 906) Form contact between the edge regions of the first and second substrates. In this process the expansion will continue radially outward until substantially full contact between the first and the second substrates is established.

In a specific embodiment, the method described above can be carried out using the bonding apparatus 600 of FIG. 6. The method is discussed below with reference to FIGS. 8A-8C according to a specific embodiment of the invention. However, it is understood that the method can also be performed using other suitable apparatus.

Process 903 includes supporting the second substrate peripherally to maintain a predetermined distance between the first substrate and the second substrate. In FIG. 8A, the second substrate 622 is supported peripherally by support members 605 to maintain a predetermined distance between the first substrate 621 and the second substrate 622.

Process 904 includes causing the second substrate to elastically deform. In FIG. 8B, pressure bar 609 is used to push the central portion of the second substrate 622 toward the first substrate 621

In Process 905, the initial contact between the first and second substrates is expanded radially outward. In FIG. 8B, the support members 605 are moved outward from recessed region 603. As the beveled surface 606 slides away from substrate 622, the peripheral separation between the two substrates is gradually reduced. Eventually, as the separation between peripheral regions of the first and the second substrates continues to decrease, a contact is progressively established between the edge regions of the first and the second substrates (Process 906).

In some embodiments, the method also includes applying pressure and heat to the second or both substrates. For example, in FIGS. 8A-8C, block 608 is used as a weight to press the second substrate against the first substrate to promote bonding. In another example shown in FIG. 6A, a heating element 630 allows substrate bonding to take place at an elevated temperature. The substrates are thermally expanded but the recess wall 603 restricts further expansion that provides more constrained pressure overall bonded substrate.

The method illustrated above has many advantages over conventional techniques. For example, in conventional methods, air pockets can be trapped between bonded substrates, especially in the areas 351 (see FIG. 3) due to characteristic topography of the extended roll off edge of the substrates. According to embodiments of the present invention, initiating the contact in a center region of the wafers and allowing the bonding to proceed to the periphery under additional pressure can push out air pockets. In an embodiment, this bonding technique enables forming bonded substrates having reduced edge exclusion region and significantly reduced the number of air pockets or voids between bonded wafers.

In a specific embodiment, bonded silicon wafers having 1 mm edge exclusion has been formed using the methods discussed above. First, suitable substrates are selected according to the edge characterization method of FIG. 5. Then the wafers are bonded together using the method described above in connection with FIG. 9.

The above sequence of processes provides a method for forming bonded substrates according to an embodiment of the present invention. As shown, the method uses a combination of processes including a way of supporting the substrate to initiate pressurized contact between center portions of two substrates and allowing the bonding to propagate to outer portions of the substrates under a condition of constrained bond strengthening. Other alternatives can also be provided where steps are added, one or more steps are removed, or one or more steps are provided in a different sequence without departing from the scope of the claims herein. Further details of the present method can be found throughout the present specification.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A method for forming bonded substrates, the method comprising:
   providing a plurality of substrates, each of the plurality of substrates having a top surface;
   determining a characteristic length for each of the plurality of substrates by:
      determining a profile of the top surface of the substrate from an interior portion to an edge portion along a radial direction;
      determining a highest point of the profile the highest point being higher than the interior portion; and
      defining the characteristic length as a distance from the highest point to the edge portion;
   selecting a first substrate and a second substrate from the plurality of substrates, at least one of the first and the second substrates having a characteristic length shorter than a predetermined length;

bringing the first substrate and the second substrate into contact, the top surface of the first substrate facing the top surface of the second substrate; and causing the first and the second substrates to form the bonded substrates.

2. The method of claim 1 wherein the profile of the top surface for each of the plurality of substrates is determined using a surface profiling apparatus.

3. The method of claim 1 wherein the profile of the top surface for each of the plurality of substrates is determined using an atomic force microscope.

4. The method of claim 1 wherein each of the plurality of substrates is a silicon wafer.

5. The method of claim 1 wherein the interior portion is near a center point of the substrate.

6. The method of claim 1 wherein the predetermined length is related to a length of non-bonded edge region.

7. The method of claim 1 wherein the predetermined length is about 1 mm.

8. The method of claim 1 wherein the highest point of the profile is from about 200 nm to about 800 nm above the interior portion.

9. The method of claim 1 wherein the characteristic length is in a range of about 1.5 mm to about 10 mm.

10. The method of claim 1 further comprising applying pressure or pressure and heat to the first and the second substrates.

11. A method for selecting a substrate for forming bonded substrates, the method comprising:

providing a substrate, the substrate having a top surface, the top surface including an interior portion and an edge portion;

determining a profile of the top surface from the interior portion to the edge portion along a radial direction;

determining a highest point of the profile the highest point being higher than the interior portion;

determining a length from the highest point to the edge portion; and selecting the substrate for bonding with a second substrate to form bonded substrates if the length is less than a predetermined length.

12. The method of claim 11 wherein the profile of the top surface of the substrates is determined using a surface profiling apparatus.

13. The method of claim 11 wherein the profile of the top surface of the substrate is determined using an atomic force microscope.

14. The method of claim 11 wherein the substrate is a silicon wafer.

15. The method of claim 11 wherein the predetermined length is related to a length of non-bonded edge region.

16. The method of claim 11 wherein the interior portion is near a center point of the substrate.

17. The method of claim 11 wherein the highest point of the profile is from about 200 nm to about 800 nm above the interior portion.

18. The method of claim 11 wherein the characteristic length is in a range of about 1.5 mm to about 10 mm.

19. A method for forming bonded substrates having non-bonded edge region shorter than a predetermined edge exclusion length, the method comprising:

determining a target characteristic length based on the predetermined edge exclusion length;

for each of a plurality of substrates determining a characteristic length by:

determining a profile of the top surface of the substrate from an interior portion to an edge portion along a radial direction;

determining a highest point of the profile the highest point being higher than the interior portion; and defining the characteristic length as a distance from the highest point to the edge portion;

selecting a first substrate and a second substrate from the plurality of substrates, at least one of the first and the second substrates having a characteristic length shorter than the target characteristic length; and causing the first and the second substrates to form the bonded substrates.

20. The method of claim 19 wherein the each of the substrates is a silicon wafer.

21. The method of claim 19 wherein the target characteristic length is substantially equal to the predetermined edge exclusion length.

22. The method of claim 19 wherein the predetermined edge exclusion length is about 1 mm and the target characteristic length is repeatably in a range from about 1 mm to about 1.5 mm.

* * * * *